United States Patent [19]

Zimmer

[11] 4,146,836
[45] Mar. 27, 1979

[54] POWER MONITOR

[75] Inventor: Darrel E. Zimmer, North Park, Ill.

[73] Assignee: Barber-Colman Company, Rockford, Ill.

[21] Appl. No.: 826,287

[22] Filed: Aug. 22, 1977

[51] Int. Cl.$^2$ ............................................. G01R 23/02
[52] U.S. Cl. ................................ 324/78 Z; 324/79 D
[58] Field of Search ................. 324/79 R, 79 D, 81,
324/78 Z, 78 R; 307/233 R, 233 B; 328/140, 141

[56] References Cited
U.S. PATENT DOCUMENTS

| 3,450,991 | 6/1969 | Hornoch | 324/79 D |
| 3,795,169 | 3/1974 | Belcher | 324/78 Z |
| 4,020,418 | 4/1977 | Burrage | 324/79 D |

Primary Examiner—M. Tokar
Attorney, Agent, or Firm—Robert M. Hammes, Jr.

[57] ABSTRACT

A signal monitoring device useful to monitor power consumption level employs a phase locked loop and an associated frequency reduction circuit to convert relatively low frequency input pulse signals to an output signal representative of power consumption.

31 Claims, 2 Drawing Figures

POWER MONITOR

BACKGROUND OF THE INVENTION

This invention relates to signal monitoring devices and especially to such devices useful in monitoring power consumption level. There is presently a need for monitoring devices which provide an instantaneous indication of the input signal level. A particular example of this is the monitoring of power consumption levels to facilitate load shedding so as to maintain power consumption below a certain maximum level.

Various types of devices have been utilized in the past to monitor power consumption. Recording devices are available which record power consumption data on charts. But this type of device is generally only useful for a recording of historical data and does not provide an instantaneous output signal which can be used in a load shedding application.

The use of electronic watt meters has been the standard method for obtaining energy consumption data for large power consumers. While many of these devices are capable of providing an instantaneous output signal, they have many shortcomings. Electronic watt meters generally require current sensing transformers installed in the power lines to supply the watt meter with line current information. In addition, line voltage amplitude must be sensed to provide a voltage component necessary for power computation. Installation of the transformer and voltage sensing means is frequently expensive and in some instances is not feasible.

It is desirable to provide a way to monitor power consumption which does not involve the installation of additional auxiliary equipment in the power lines. Known power demand meters utilized by the utility companies for determining power usage are capable of providing a pulse signal which is representative of the rate of power consumption. By providing a monitoring device capable of decoding such a pulse signal the need for installation of auxiliary equipment in the power lines is eliminated. Two methods of accomplishing this decoding are time-to-voltage conversion and frequency-to-voltage conversion. A basic shortcoming of time-to-voltage conversion systems is that the output signal does not exhibit satisfactory linearity characteristics. While it has been found that frequency-to-voltage conversion devices generally exhibit better linearity, problems are encountered in applications in which the pulse signal is of a relative low frequency. This situation is encountered in monitoring power consumption since the demand meter pulse rates are generally quite low (typically 8–500 pulses per minute).

Another characteristic which is desirable in signal monitoring devices of this type is that it be adaptable to various installations in which the output signal being monitored may reach different maximum levels. For example, in power consumption monitoring applications one power utilization facility may consume power at one maximum rate while another such facility consumes power at a different maximum rate. It is desirable to provide a monitoring device suitable for use in facilities having different maximum consumption rates. In such cases the output signal of the monitoring device could be sent to a meter which provides a reading as a percent of the maximum power consumption.

SUMMARY OF THE INVENTION

According to the invention, a signal monitoring device is provided for converting a relatively low frequency signal to a voltage signal. In applications for monitoring power consumption this voltage signal is substantially linearly proportional to the power consumption level being monitored. Means is provided for comparing the frequencies of the input pulse signal and a reference signal. A reference signal may be supplied by a signal generator, such as a voltage controlled oscillator, which adjusts the reference signal frequency in response to the variations in a control signal dependent upon the frequency differences sensed by the frequency comparing means. A frequency dividing circuit is provided to reduce the frequency of the reference signal to the relatively low frequency levels of the input pulse signal. When the frequencies of the input pulse signal and the reference signal are substantially equal, the control signal is representative of the frequency of the input pulse signal. Thus, this control signal can be utilized as the output of the monitoring device. In power consumption monitoring applications, this control signal is indicative of the level of power consumption.

In order to provide a monitoring device which is adaptable for various installations, the frequency reduction circuitry is preferably provided with means for selecting the level of frequency reduction of the generated reference signal. By selecting a proper frequency reduction factor, the monitoring device can be set to provide maximum output when the pulse rate of the input signal is at a maximum for a given installation.

In order to obtain a high degree of accuracy, it is preferable to provide an input pulse signal which is substantially free of extraneous signal components. In the present invention this is accomplished by providing a wave shaping means which conditions the input signal.

An additional feature which is preferably provided is a means to eliminate extraneous signal components in the output signal of the monitoring device which may occur during updating of the control signal by the frequency comparing means. Sample and hold circuitry is provided which interrupts the output signal during updating while at the same time holding the signal at the level existing immediately prior to the updating.

Other advantages and features will become apparent from the following detailed description taken in conjunction with the drawing figures.

DETAILED DESCRIPTION OF THE PREFERRED EMBODIMENT

Figure 1:
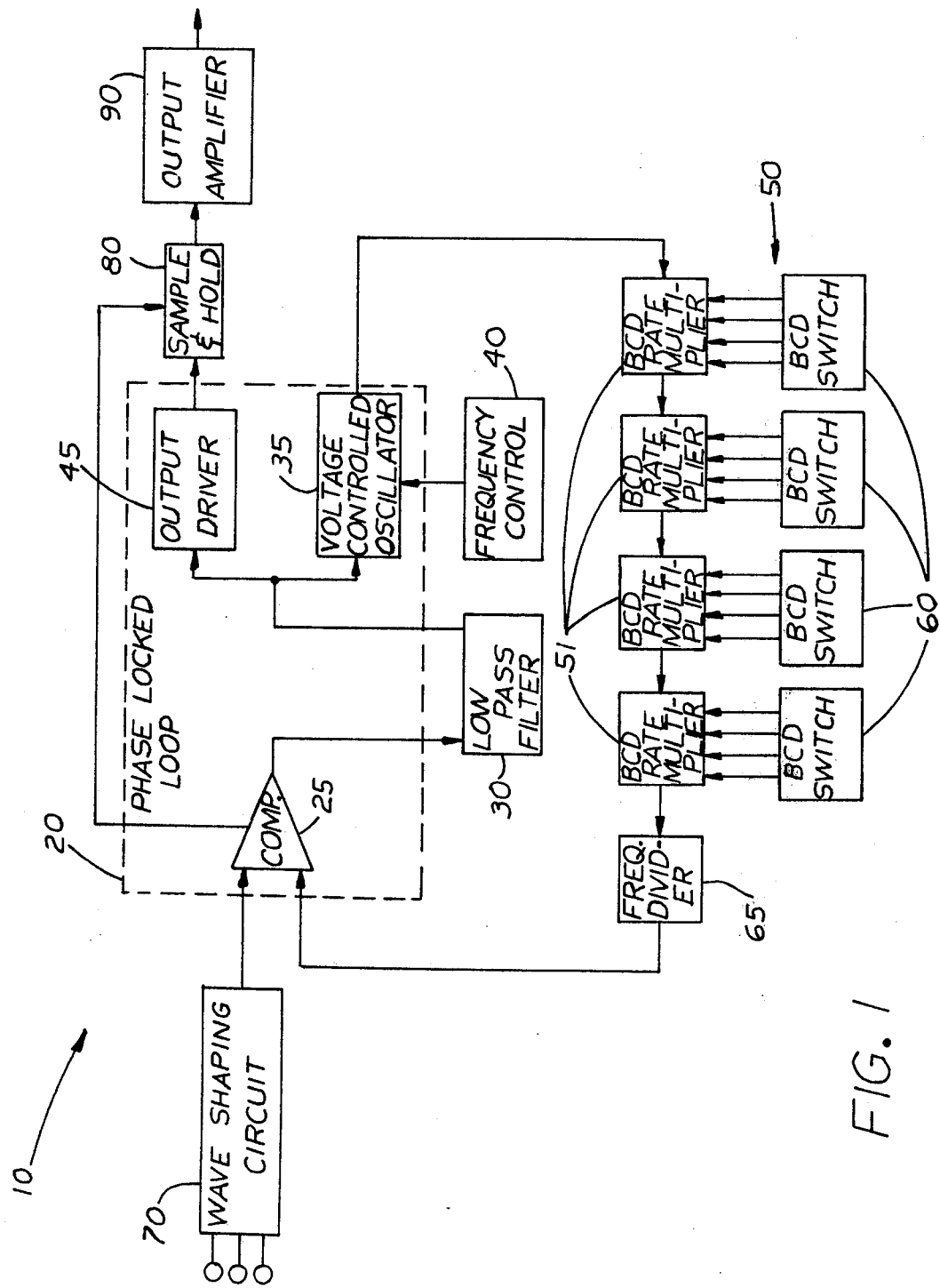
FIG. 1 is a block diagram of a signal monitoring device according to the invention.

According to the invention, a signal monitoring circuit, generally indicated at 10, in FIG. 1, is provided for converting an input pulse signal to a voltage signal which is representative of the input signal. The circuit is particularly useful in connection with low frequency input pulse signals which may, for example, range from eight to five hundred pulses per minute. It will be readily apparent that this type of frequency-to-voltage conversion device can be used in numerous applications and consequently, the invention is not limited to any one particular application. For the sake of convenience, the invention will be described as it may be used for monitoring power consumption. The output of the device is such that it can be supplied to various types of equipment utilized in power monitoring applications. For example, the output of the monitoring device could be fed to a meter to show the percent of maximum power consumption on a given application at a particular time or it could be fed to control equipment for load shedding. A phase locked loop 20 is provided for comparison of the input pulse signal with a reference signal and for generating an output signal representative of the level of power consumption. As shown in FIG. 1 phase locked loop 20 has a comparator 25 which compares the frequency of the input pulse signal to the frequency of a reference signal. Comparator 25 senses differences between these two signals and generates an error signal which is preferably fed to low pass filter 30 to produce a control signal which is in turn fed to a reference signal generating means such as voltage controlled oscillator (VCO) 35 which generates a reference frequency signal in response to the control signal. The natural frequency of VCO 35 is set by frequency control 40. In addition to controlling VCO 35, the control signal is also fed to output driver 45 for use as the output signal on the monitoring device. Since the reference signal generated by VCO 35 is of relatively high frequency, it is necessary to reduce this frequency to match the frequency of the input pulse signal. This is accomplished by feeding the reference signal from VCO 35 through a frequency reducing means such as frequency dividing circuit 50. While any suitable circuit can be utilized to accomplish this purpose, the preferred embodiment employs a plurality of BCD rate multiplier circuits 51 connected so as to provide the desired level of frequency reduction. In order to provide the flexibility needed to be able to use the power monitoring device in a wide variety of applications which have dissimilar maximum power consumption rates, it is desirable to provide means which permit adjustment of the degree of frequency reduction. It is possible to make such adjustments by means of frequency control 40, and in some applications this will be satisfactory. However, in order to obtain a wider range of possible frequency reduction, it is preferable to provide a suitable switch means as part of frequency dividing circuit 50 to permit selection of the desired degree of frequency reduction over a broad range. In the preferred embodiment this switch means comprises a plurality of BCD switches 60 associated with respective ones of BCD rate multipliers 51. Rate multipliers 51 and switches 60 are typically of a type which are readily commercially available. A given switch 60 can be set so that a given number of pulses will pass through its associated rate multiplier 51 for every ten pulses of the reference signal. For example, by setting a switch at a decimal value of six, six pulses will pass through its associated rate multiplier for every ten pulses of the reference signal. By way of further example, four digits of control can be obtained by properly cascading four multipliers so that it is possible to divide the frequency of the reference signal by any number from one through ten thousand simply by setting the four associated switches. In practice, the operation of rate multipliers 51 may be somewhat non-symmetrical and consequently it is preferable to provide an additional frequency divider 65 to reduce the jitter caused by such non-symmetrical operation to an insignificant amount of the overall reference signal.

It is possible that extraneous signal components may be picked up by the input pulse signal. For example, in a power monitoring application an impulse generator may be installed in the power demand meter which senses disc rotation and momentarily energizes a small internal relay in proportion to the rotation rate. Generally, a larger isolation relay is connected to the internal relay to provide isolation and higher switching capacity. The contacts of the isolation relay are then connected to the input terminals of the power monitoring device 10. Extraneous signal components picked up may be due to contact bounce in the isolation relay. Also extraneous noise may be picked up on the wires connecting the isolation relay to the monitoring device. The effects of such extraneous signal components are reduced by feeding the input pulse signal through wave shaping circuit 70 so that a well-formed input pulse signal is fed to comparator 25.

In an additional refinement of the invention, means is provided to eliminate the effects of extraneous signal components in the signal provided by output driver 45 which may occur during updating of the control signal by comparator 25. Thus, the signal from output driver 45 is fed through sample and hold circuit 80 which is designed to sustain the output signal during updating of the control signal. When comparator 25 detects a frequency difference between the input pulse signal and the reference signal it sends a signal to sample and hold circuit 80 which opens a switch to inhibit updating of the output signal until updating of the control signal is completed. When the frequencies of the input pulse signal and the reference signal are substantially equal and updating of the control signal is completed, comparator 25 sends a signal to sample and hold circuit 80 permitting updating of the output signal.

Output amplifier 90 is provided simply to adjust the output signal to levels suitable for use by a meter, a load shedding control system and the like.

Figure 2:
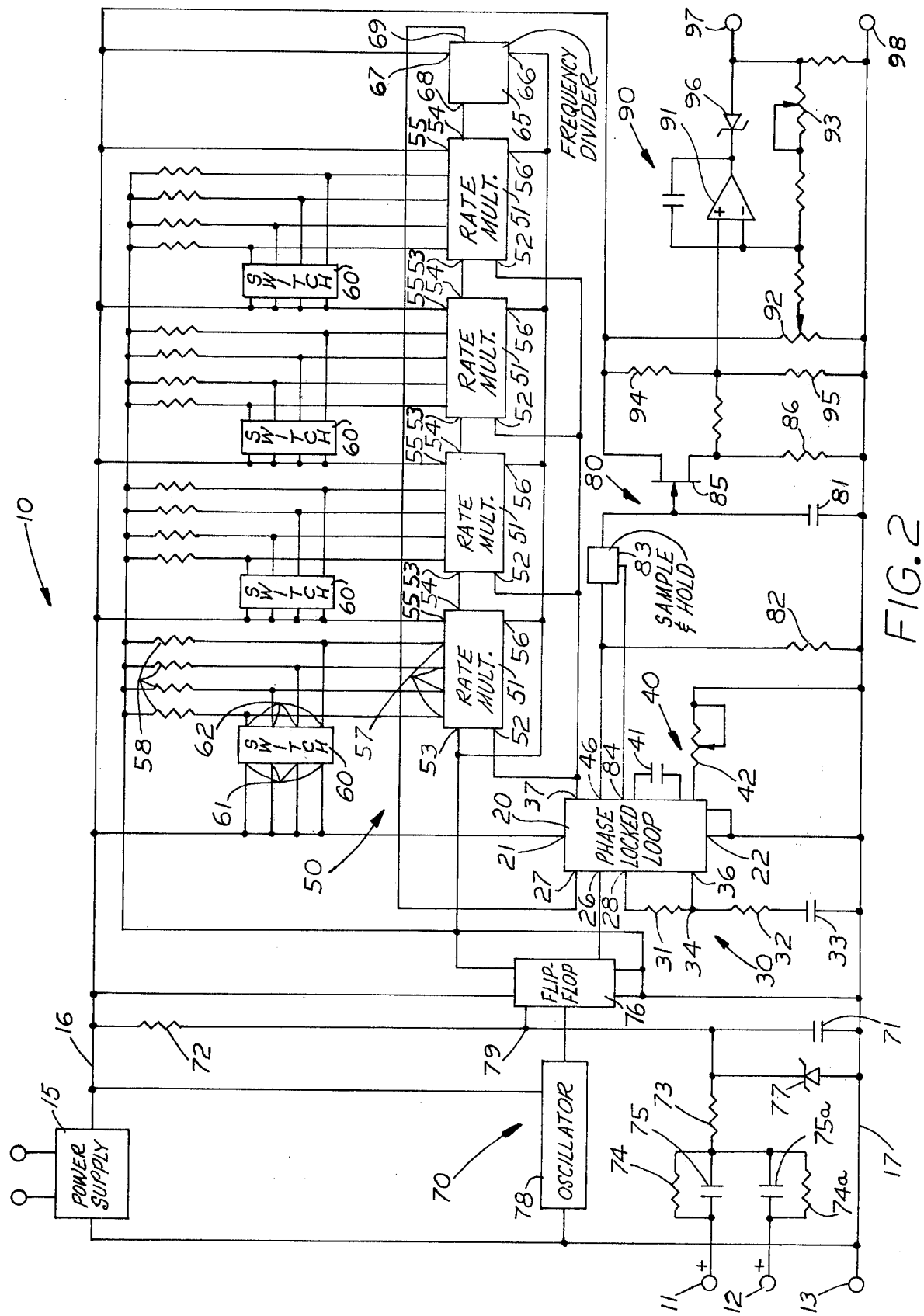
FIG. 2 is a schematic diagram of the preferred embodiment of the invention.

Referring now to FIG. 2, an exemplary circuit according to the invention suitable for use in a power monitoring application is generally indicated at 10. Power supply 15 provides a source of constant voltage for the power monitoring device and typically is designed to convert 120 volt AC to a suitable DC voltage.

Phase locked loop 20 is connected between constant voltage supply line 16 and common 17 at power terminals 21, 22 respectively. In the embodiment shown, phase locked loop 20 is a commercially available integrated circuit, such as a CA 4046 AE manufactured by RCA Corporation, comprising a phase comparator, a VCO and means to provide an output signal as previously described with respect to FIG. 1. The input pulse signal is fed to terminal 26 and controlled frequency reference signal is sent to terminal 27. The internal phase comparator of phase locked loop 20 detects frequency differences between these two signal and sends a representative error signal to comparator output terminal 28 where it is fed through low pass filter 30. As shown in FIG. 2, filter 30 preferrably comprises resistors 31, 32 and capacitor 33 connected in series between terminal 28 and common 17. Filter 30 provides the control voltage for the internal VCO of phase locked loop 20 and is connected at junction 34 to VCO input terminal 36. Input to filter 30 is present only during the time that the internal phase comparator of phase locked loop 20 is not satisfied and the charge on capacitor 33 is updated in response to the error signal present at terminal 28. The voltage across resistor 32 and capacitor 33 is the control voltage which is fed to VCO input terminal 36. Thus, filter 30 provides filtering and memory for the VCO control voltage. The controlled frequency signal generated by the internal VCO of phase locked loop 20 is fed from VCO output terminal 37 to frequency dividing circuit 50. The natural frequency of the internal VCO is set by frequency control circuitry 40 which is external to phase locked loop 20. In this embodiment, frequency control circuitry 40 comprises capacitor 41 and variable resistor 42. Resistor 42 is adjustable to provide a degree of calibration flexibility. Capacitor 41 and resistor 42 are connected to phase locked loop 20 in conventional manner.

The VCO control voltage is also sent through an output driver means which is internal to phase locked loop 20 so as to deliver the control signal, or a signal substantially proportional to the control signal, to terminal 46. The signal at terminal 46 is representative of the rate of power consumption when the frequencies of the input pulse signal and the controlled frequency reference signal are substantially equal, that is, when phase locked loop 20 is in the locked condition.

The high frequency signal which appears at VCO output terminal 37 is divided down by frequency dividing circuit 50 so that the controlled frequency reference signal sent to terminal 27 is comparable to the input pulse signal. A plurality of frequency dividing components, such as integrated circuit rate multipliers 51, are provided to obtain the desired level of frequency reduction. The frequency signal generated by the internal VCO of phase locked loop 20 is fed from terminal 37 to respective input terminals 52 of rate multipliers 51. Each of rate multipliers 51 has respective cascade terminals 53 and divider output terminals 54. Each of rate multipliers 51 produces an output signal having a pulse rate which is some predetermined fraction of the input signal supplied to the rate multiplier. Rate multipliers 51 are sequentially connected together by means of respective cascade terminals 53 and divider output terminals 54 so that the VCO frequency signal is successively divided down by the cascaded rate multipliers 51. This signal can then be fed from the last rate multiplier in the series to terminal 27 of phase locked loop 20. Each of rate multipliers 51 has respective power terminals 55, 56 which are connected respectively to constant voltage supply line 16 and common 17. In order to select the desired degree of frequency reduction, each of a plurality of BCD switches 60 are connected by switch output terminals 62 to rate selector terminals 57 of respective rate multipliers 51. Power is supplied to switches 60 by means of a plurality of switch input terminals 61 connected to constant voltage supply line 16. Each of a plurality of pull-down resistors 58 are connected to respective ones of rate selector terminals 57 to insure that the voltages present at terminals 57 are pulled down to common when there is no input from a given switch output terminal 62 to its respective rate selector terminal 57. This is done to eliminate any transient effects which might exist at terminal 57 in the absence of resistors 58. Switches 60 are such that they can be set to produce from 0-9 output pulses at terminal 54 of their respective rate multipliers 51 for each ten input pulses to that rate multiplier. Thus, frequency dividing circuit 50 permits selection of a wide range of levels of frequency reduction. In order to compensate for jitter in the reference signal which may result from the non-symmetrical operation of rate multipliers 51, an additional frequency divider 65 is provided to further reduce the frequency level of the reference signal and thus reduce the jitter to an insignificant amount of the overall signal. Frequency divider 65 is connected by means of power terminal 66, 67 to common 17 and constant voltage supply line 16 respectively. The reference signal is fed from rate multipliers 51 to input terminal 68 of frequency divider 65. The reference signal is then sent to terminal 27 of phase locked loop 20 by means of output terminal 69 of frequency divider 65.

In order to properly condition the input signal supplied to terminal 26 of phase locked loop 20, wave shaping circuitry, generally indicated at 70, is provided. When the invention is used in a power monitoring application, it is preferable to provide input terminals for connection to both contacts of the isolation relay. In this way, a pulse is delivered each time there is a relay transition. That is, one pulse is delivered when the relay goes from an open to a closed position and another pulse is delivered when the relay goes from closed to open. This permits updating of the output signal twice as often as if there were a single connection which gave a single pulse for a complete open-to-close-to-open transition of the relay. This can be significant when pulses are being generated at very low frequency levels. Consequently, two positive circuit input terminals 11, 12 are provided for connection to the two contacts of the isolation relay. A common input terminal 13 is also provided.

Wave shaping circuitry 70 will now be described in more detail. As shown in FIG. 2, resistor 72 and capacitor 71 are connected in series between constant voltage supply lines 16 and common 17. Between input pulses capacitor 71 is charged to supply voltage through resistor 72. When an input pulse occurs at either of terminals 11, 12 capacitor 71 discharges through resistor 73 and either resistor 74 and capacitor 75 or resistor 74a and capacitor 75a. The output of this resistor-capacitor network, which comprises the voltage across capacitor 71, is taken from junction 79 between resistor 72 and capacitor 71 and is fed to a data input of flip-flop circuit 76. Zener diode 77 is connected parallel with capacitor 71 as shown to insure that excessive transients do not reach flip-flop circuit 76. The digital output of flip-flop circuit 76 provides a precisely shaped positive pulse signal as the input to the terminal 26 of phase locked loop 20. In order to operate flip-flop circuitry 76, a free running oscillator 78 is connected to a clock terminal of flip-flop circuit 76. Oscillator 78 produces a relatively high frequency pulse signal such that the period of this signal is insignificant as compared with the pulse signal from the isolation relay. The input to flip-flop circuit 76 taken from junction 79 is at the high level when the capacitor 71 is substantially fully charged. When a pulse is received on either of terminals 11, 12 capacitor 71 discharges and the signal taken from junction 79 drops to a low level. A subsequent pulse from oscillator 78 causes flip-flop circuit 76 to change state and the output fed to terminal 26 goes from a low level to a high level. The circuitry is preferably designed so that extraneous pulses due to contact bounce and noise do not interfere with the operation of flip-flop circuit 76. These pulses are typically much shorter in duration than the signal pulse. The values of capacitor 71 and resistor 73 are chosen so that the discharge time of capacitor 71 is long enough to prevent response by flip-flop circuit 76 to input pulses of less than a selected minimum duration. Thus, a sharply defined pulse signal representative of the input signal present at terminals 11, 12 and 13 is supplied to terminal 26 of phase locked loop 20.

While the output signal representative of the rate of power consumption may be taken directly from terminal 46, it is preferable to include means for providing a properly conditioned output signal for use by meters or other utilization equipment. Thus, the control signal is fed from terminal 46 of phase locked loop 20 through a sample and hold circuit generally indicated at 80 which provides an output signal which is sustained during control signal updating. Capacitor 81 is charged by the output signal and discharged through resistor 82 in response to changes in the output signal. As previously noted, extraneous signal components may appear in the output signal during updating of the output signal in response to frequency differences sensed by the internal phase comparator of the phase locked loop 20. Switch means, such as analog switch 83, is connected between output terminal 46 and capacitor 81. The internal phase comparator of phase locked loop 20 sends a switch signal from switch terminal 84 to analog switch 83 to create an open circuit during updating of the output signal. When the internal comparator of phase locked loop 20 is again satisfied updating of the control signal is completed and switch 83 is closed by a signal from switch terminal 84 thus permitting updating of the charge on capacitor 81. The voltage across capacitor 81 is representative of the rate of power consumption and this voltage is fed to a voltage sensing means, such as FET source follower 85, which in turn sends this signal to a scaling amplifier generally indicated at 90. An important characteristic of FET 85 is that it will not substantially discharge capacitor 81 and consequently the voltage is maintained constant when the output signal is interrupted by switch 83. The charge on capacitor 81 is thus updated between each incoming pulse so that the voltage across the capacitor 81 is an instantaneous indication of the input pulse rate.

The output amplifier, generally indicated at 90, is provided in order to insure that the output signal is suitable for use by a meter, a load shedding control system, or other utilization devices. The signal from FET 85 is sent to non-inverting amplifier 91 through a voltage divider network comprised of resistors 94, 95. Zero adjustment is provided by a variable resistor 92 and span adjustment is provided by variable resistor 93. Zener diode 96 is connected in series with amplifier 91, and provides a suitable constant voltage drop to insure that the positive swing of the output voltage is limited to a value which will not damage utilization devices connected to output terminals 97, 98.

It will be readily apparent to those skilled in the art that numerous modifications and variations are possible without departing from the scope and spirit of the invention. Therefore, the invention is not limited to the particular embodiments described herein and is limited only by the claims.

CLAIMS

I claim:

1. A signal monitoring device for producing an output signal indicative of the frequency of an input pulse signal, comprising: means for producing a controlled frequency reference signal in response to a control signal; means for reducing the frequency of said reference signal to a selected frequency level; switch means associated with said frequency-reducing means for selecting a level of frequency reduction; means for comparing the frequency of said reduced-frequency reference signal to the frequency of the input pulse signal; means for changing said control signal in response to an error signal from said comparing means so that the frequency of said reduced-frequency reference signal approaches the frequency of said input pulse signal, said output signal comprising the control signal and being representative of said input pulse signal when the frequencies of said reduced-frequency reference signal and said input pulse signal are substantially equal.

2. A signal monitoring device as in claim 1 wherein said reference signal producing means comprises a voltage controlled oscillator.

3. A signal monitoring device as in claim 2 wherein said control signal changing means comprises a low pass filter.

4. A signal monitoring device as in claim 1 additionally comprising wave shaping circuitry to shape said pulse input signal so as to limit the effect of transient components in the signal presented to said frequency comparing means.

5. A signal monitoring device as in claim 4 wherein said wave shaping circuitry comprises a flip-flop circuit having an input for receiving said input pulse signal and oscillator means for providing continuous pulses to said flip-flop circuit so as to cause an output of said flip-flop circuit to switch between high and low states in response to pulses of said input pulse signal.

6. A signal monitoring device as in claim 5 wherein said wave shaping circuitry additionally comprises a resistance-capacitance network through which said input pulse signal is fed to said flip-flop circuit, said resistance-capacitance network adapted to reject any pulses which are less than a selected minimum duration.

7. A signal monitoring device as in claim 1 additionally comprising means adapted to inhibit transients in said output signal during control signal updating.

8. A signal monitoring device as in claim 7 wherein said inhibit means comprises sample and hold circuitry adapted to sustain said output signal during control signal updating in response to frequency comparison.

9. A signal monitoring device as in claim 8 wherein said sample and hold means comprises capacitance means charged by said control signal, switching means connected to selectively interrupt the delivery of said control signal to said capacitance means during control signal updating, and means to sense the voltage across said capacitance means, said output signal being a function of the output of said voltage sensing means.

10. A signal monitoring device as in claim 9 wherein said switching means comprises an analog switch.

11. A signal monitoring device as in claim 9 wherein said voltage sensing means does not substantially discharge said capacitance means during updating of said control signal.

12. A signal monitoring device as in claim 1 wherein said frequency reducing means comprises a plurality of BCD rate multiplier circuits.

13. A signal monitoring device as in claim 12 wherein said frequency reducing means additionally comprises a frequency dividing circuit connected between said BCD rate multiplier circuits and said frequency comparing means, said frequency dividing circuit adapted to reduce the effect of non-symmetrical signal components from the BCD rate multiplier circuits.

14. A signal monitoring device as in claim 12 wherein said switch means comprises a plurality of BCD switches associated with respective ones of said BCD rate multiplier circuits, each of said BCD switches being independently adjustable to select the frequency reduction level for said respective BCD rate multiplier circuits.

15. A power monitoring device for converting a low frequency input pulse signal representative of power consumption to an output signal which is substantially linearly proportional to power consumption level, comprising: signal generating means responsive to a control signal for providing a variable low frequency reference signal for comparison with said input pulse signal; comparison means for detecting differences between said variable low frequency reference signal and said input pulse signal; means for providing said control signal in response to frequency differences detected by said comparison means so that the frequency of said variable low frequency reference signal approaches the frequency of said input pulse signal, said output signal comprising the control signal when the frequencies of said controlled low frequency reference signal and said input pulse signal are substantially equal.

16. A power monitoring device as in claim 15 wherein said signal generating means comprises a voltage controlled oscillator which produces a variable frequency signal in response to said control signal, and means for reducing the frequency of said variable frequency signal to a selected fraction of said variable frequency signal.

17. A power monitoring device as in claim 16 wherein said frequency reducing means comprises a frequency dividing circuit and switch means associated with said circuit for selectively varying the degree of frequency reduction.

18. A power monitoring device as in claim 17 wherein said frequency dividing circuit comprises a BCD rate multiplier circuit.

19. A power monitoring device as in claim 18 wherein said switch means comprises a BCD switch connected to said BCD rate multiplier circuit.

20. A power monitoring device as in claim 17 wherein said frequency dividing circuit comprises a plurality of the BCD rate multiplier circuits.

21. A power monitoring device as in claim 20 wherein said switch means comprises a plurality of BCD switches, each of said BCD switches being associated with respective ones of said BCD rate multiplier circuits, each of said BCD switches being independently adjustable to select a frequency reduction effect of a respective one of said BCD rate multiplier circuits.

22. A power monitoring device as in claim 20 wherein said frequency reducing means additionally comprises a frequency divider connected between said BCD rate multiplier circuits and said comparison means, so as to reduce the effect of non-symmetrical signal components from said BCD rate multiplier circuits.

23. A power monitoring device as in claim 15 wherein said control signal providing means comprises a low pass filter responsive to an error signal from said comparison means representative of detected frequency differences.

24. A power monitoring device as in claim 15 additionally comprising means to inhibit transients in said output signal during control signal updating.

25. A power monitoring device as in claim 24 wherein said inhibit means comprises sample and hold circuitry adapted to sustain said output signal during control signal updating.

26. A power monitoring device as in claim 25 wherein said sample and hold means comprises capacitance means charged by said control signal, switching means connected to selectively interrupt the delivery of said control signal to said capacitance means during control signal updating, the charge level of said capacitance means remaining unchanged during said interruption.

27. A power monitoring device as in claim 26 wherein said switching means comprises an analog switch.

28. A power monitoring device as in claim 25 wherein said sample and hold circuitry additionally comprises means to sense the voltage across said capacitance means, the output of said voltage sensing means being representative of power consumption level.

29. A power monitoring device as in claim 15 additionally comprising wave shaping circuitry to shape said input pulse signal so as to limit the effect of transient components on the signal fed to said comparison means.

30. A power monitoring device as in claim 29 wherein said wave shaping circuitry comprises a flip-flop circuit having an input for receiving said input pulse signal and an output for delivering a pulse signal to said comparison means, and oscillator means for providing pulses to said flip-flop circuit so as to cause the output of said flip-flop circuit to switch between high and low states in response to pulses of said input pulse signals.

31. A power monitoring device as in claim 29 wherein said wave shaping circuitry additionally comprises resistance-capacitance circuitry through which said input pulse signal is fed to said flip-flop circuit, said resistance-capacitance circuitry adapted to reject input pulses which are less than a selected minimum duration.

* * * * *